United States Patent

Simon et al.

[11] Patent Number: 5,959,844
[45] Date of Patent: Sep. 28, 1999

[54] INSTRUMENT CLUSTER

[75] Inventors: Ernst-Ulrich Simon, Oberursel; Stephan Zech, Eltville; Norbert May, Frankfurt, all of Germany

[73] Assignee: VDO Adolf Schindling AG, Frankfurt, Germany

[21] Appl. No.: 08/303,606

[22] Filed: Sep. 9, 1994

[30] Foreign Application Priority Data

Sep. 25, 1993 [DE] Germany .............................. 43 32 716

[51] Int. Cl.$^6$ .................................................. H05K 5/00
[52] U.S. Cl. ...................... 361/759; 361/644; 361/645; 361/681; 361/730; 361/752; 361/807; 361/809; 361/825; 361/826; 307/80.1; 73/866.3; 324/156
[58] Field of Search ..................... 361/752, 826, 361/644, 645, 683, 679, 681, 728, 730, 736, 748, 749, 792, 759, 825, 807, 809; 307/80.1; D12/192; 73/431, 866.3, 432.1; 324/156; 248/27.1, 916; 403/67, 68, 201

[56] References Cited

U.S. PATENT DOCUMENTS

| 4,478,331 | 10/1984 | Ruin ........................................ 206/334 |
| 5,430,612 | 7/1995 | Simon et al. ........................... 361/752 |
| 5,495,076 | 2/1996 | Davis ...................................... 174/254 |

FOREIGN PATENT DOCUMENTS

| 0420650 | 4/1991 | European Pat. Off. . |
| 0499549 | 8/1992 | European Pat. Off. . |
| 2121583 | 12/1983 | United Kingdom . |

*Primary Examiner*—Leo P. Picard
*Assistant Examiner*—Phuong T. Vu
*Attorney, Agent, or Firm*—Martin A. Farber

[57] ABSTRACT

An instrument cluster having a housing, a system support (21) to receive indicating instruments, and a circuit board (6) which is connected by fastening elements (35) to the system support (21) and mounted in floating fashion.

49 Claims, 6 Drawing Sheets

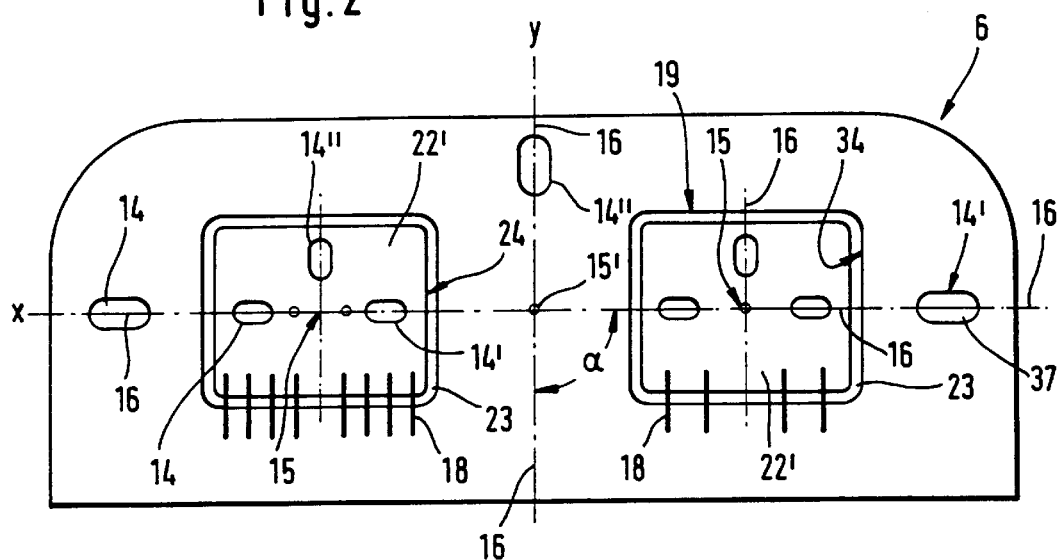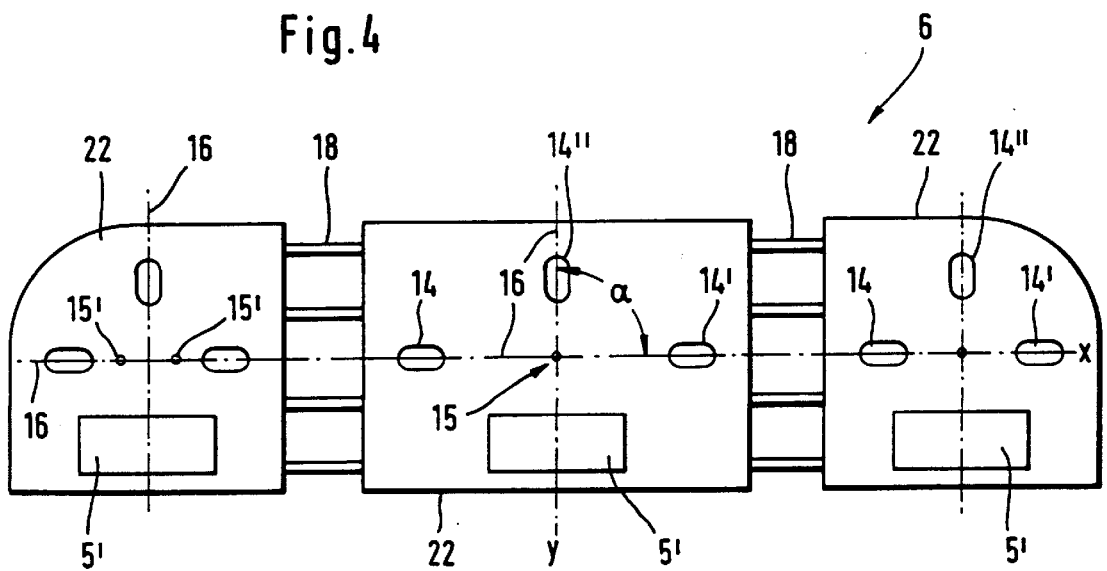

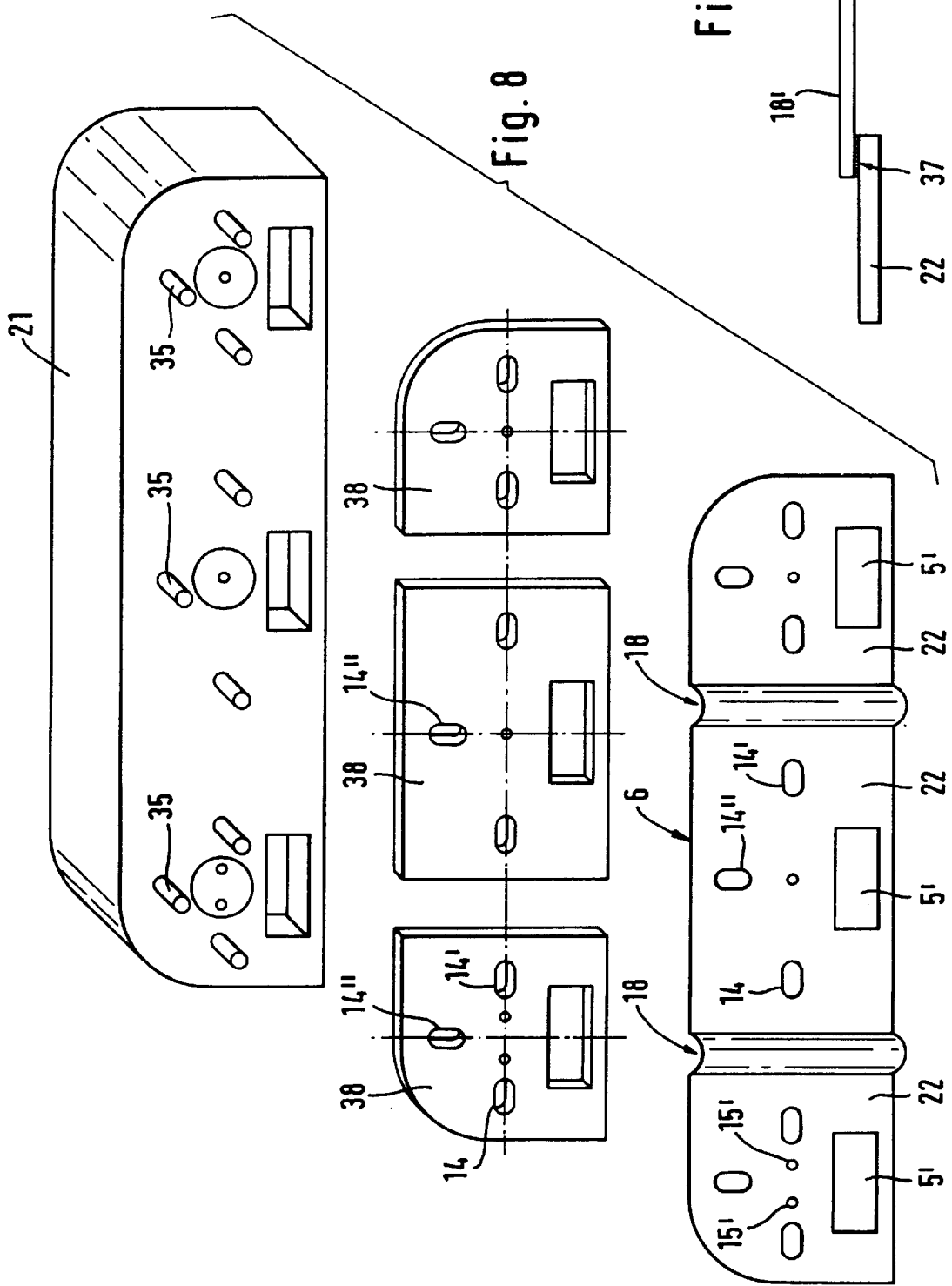

5,959,844

INSTRUMENT CLUSTER

FIELD AND BACKGROUND OF THE INVENTION

The present invention relates to an instrument cluster having a housing, a system support to receive indicating instruments, and a circuit board which is connected by fastening elements to a system support.

An instrument cluster is already generally known which consists of a system support having a circuit board and various indicating instruments and indicating displays, The individual parts consist in part of rigid plastic and are connected to each other by connections which are also rigid. If the outside temperature or the operating temperature of the vehicle increases greatly, the instrument clusters with the corresponding indicating instruments expand and large inaccuracies in indication can occur, since for instance, the measurement mechanisms which are arranged on the circuit board can shift with respect to the dials.

SUMMARY OF THE INVENTION

It is an object of the invention to develop the system support or the circuit board in such a manner for the reception of instruments that, even in the event of very large variations in temperature, exact measurement results can be communicated to the driver.

According to the invention, the circuit board (6) is mounted movably with respect to the system support (21) by means of fastening elements (35).

In this way, an uncoupling of individual parts which are arranged opposite each other with respect to the system support is obtained, so that the indicating instruments or LCD displays remain fully operable even in the event of very large temperature variations between minus 40° and plus 80° C., without readjustment being necessary.

For this purpose, it is advantageous that the circuit board (6) and/or the system support (21) be divided into two or more circuit-board sections (22) and/or system-support sections, which are displaceable independently of each other in at least one plane and that the individual circuit-board sections (22) which are equipped with at least one individual indicating instrument or an individual display rest via connecting elements (18) or support elements on circuit-board sections (22) or on the parts associated with the circuit-board sections (22).

By the advantageous development of the circuit board very large units can also be used as circuit board for an instrument cluster without having to fear that the measurement instruments will give erroneous indications in the event of very large variations in temperature. Due to the possibility of arranging very small separate circuit-board sections alongside of each other, a large number of measurement instruments or indicating displays can be associated with the very large circuit board which is formed by the individual circuit-board sections. If the individual circuit-board sections expand, the advantageous alignment of the individual openings provides assurance that the pointer axis of the corresponding instrument is not affected, since the axes of the opening or the point of intersection of the axes is identical to the center of the pointer axis. By the division into individual circuit-board sections, it is also possible in simple manner to expose the entire circuit board with the individual circuit-board sections to large variations in temperature without changes in the accuracy of the indication. The individual indicating elements, which are in a functional relationship to each other can shift with respect to each other due to the advantageous mounting and the subdivision of the circuit-board sections into several sections, without indications being falsified.

An additional possibility, in accordance with a further development of the apparatus of the invention, is that the individual circuit-board sections (22) be connected via connecting elements (18) or support elements to adjacent circuit-board sections (22) and be movable independently of each other with respect to adjacent circuit-board sections (22) and/or the system support or cluster housing (21). By the individual connecting elements or support elements, a simple supporting of the circuit-board sections is assured in inexpensive manner and it is furthermore made possible for them to shift with respect to the system support or other circuit-board sections.

In accordance with a preferred embodiment of the solution in accordance with the invention, it is finally provided that the connecting elements (18) or support elements permit displacement of the circuit-board sections (22) with respect to each other.

It is of particular importance for the present invention that the connecting elements (18) or support elements be of variable length or be elastic. In this way, a displacement of a circuit-board section with respect to the adjacent circuit-board section is possible without the circuit-board sections or the corresponding measuring systems interfering with each other. Variations in temperature or selective vibrations can also be compensated for.

In connection with the development of the arrangement in accordance with the invention, it is advantageous that the circuit board (6) and/or the system support or the cluster housing (21) have one or more cutouts into which the circuit-board sections (22) and/or system-support sections are introduced, the sections serving to receive indicating elements and/or operating elements.

In accordance with the invention, the circuit board has several cutouts in which circuit-board sections are floatingly mounted. It is, of course, also possible to develop the system support in similar manner and provide it with corresponding system-support sections which are floatingly mounted with respect to the main system support.

It is furthermore advantageous for the outer boundaries (24) of the circuit-board sections (22) contained in the cutouts (23) to be on all sides at approximately the same distance from the inner boundaries (34) forming the cutout (23).

Furthermore, it is advantageous for the circuit-board sections (22) received in the cutouts (23) to be connected movably with the circuit board by the numerous connecting elements (18) and for the circuit board (6) or the circuit-board sections (22) to have openings (14) which are arranged on a plane which intersects the center point (15) of an indicating system or indicating display (5, 5').

Furthermore, it is advantageous for the circuit-board sections to have numerous openings (14) which are arranged on two or more axes intersecting at an angle ($\alpha$) which intersect the measurement center point (15) of the measurement system or its pointer axis or the indicating display (5') or approximately the center point of the circuit-board section (22). The arrangement of the individual openings is, in this way, so developed that the point of intersection of the axes is identical to the center point of the indication axis or indicating system. The x-zero point, determined by holes, is located in the center of the indicating display. In this way, the result is obtained that the distance from the x-zero point to the outermost point of contacting is minimized. This minimizing has the result that slight changes in difference caused by temperature can be taken up by the contacting elements.

An additional possibility in accordance with a further development of the apparatus of the invention is for the indicating system (5) or indicating display (5') or the operating element to have a center axis (16) which extends perpendicular to the openings (14) and/or parallel to their side walls and/or the axis (37) which extends through the opening.

As a further development of the invention it is advantageous for the openings (14) of the circuit-board sections (22) to be developed as slots the longitudinal center axis (16) of which extending in the longitudinal direction of the slots (14) intersect the measurement center point (15) of the measurement system (5, 5') or, in the case of at least two measurement systems, extend through the two measurement center points (15'). The individual slots readily permit relative displacement of the circuit-board sections with respect to each other and also with respect to the system support, without special measures having to be taken for this.

It is also advantageous for the connecting elements (18) to be developed as electrically conductive connecting elements (18) which connect the circuit boards (6) to each other, and for the system support (21) or the circuit-board sections (22) for the receiving of the measurement systems (5) to be received movably via pins (35) in the slots (14). The individual connecting elements assure the transmission of signal voltage and supply voltage between the individual circuit-board elements.

In order to make the mounting of the instrument cluster and of the individual circuit-board sections particularly simple, it is provided that the pins (35) be arranged on one side of the system support (21) and form a right angle (β) with the surface (36) of the side of the system support (21).

It is furthermore advantageous for the longitudinal center axis (16) of at least one longitudinal slot (14) provided in the central region of the circuit board (6) to extend parallel or in longitudinal direction to the longitudinal axis (x) of the circuit board (6). It is an advantage for the longitudinal center axis (16) of at least one other slot (14) provided outside the central region of the circuit board (6) to extend parallel or in longitudinal direction to the transverse axis (y) of the circuit board (6). It is an advantage for the pins (35) to be displaceably received approximately in the center of the slots (14) and serve to receive threaded bolts (20) via which individual circuit-board sections (22) can be fastened.

Furthermore, it is advantageous that, for the fastening of the circuit board (6), the dial (8), and/or the operating elements to the circuit board (6), additional slots (14") be provided in the circuit board (6) and in the dial. The lengthwise direction of these slots (14") is from a central zero point (39) of the circuit board (6) or of the dial (8) to the center of the corresponding slot (14). It is an advantage for the zero point (39) to be the center (15) of the slot (14''') which is arranged in the central region and directed in the transverse direction (y).

As further development of the invention, it is advantageous for the circuit board (6) and/or the indicating systems (5) to be mounted movable perpendicular to the lengthwise direction of the slots (14), and for the indicating systems (5) contained in cutouts (23) to be arranged perpendicular to the lengthwise direction of the cutouts (23) and to be connected via resilient webs indirectly or directly to the system support (21).

By the advantageous alignment and arrangement of the individual slots with the corresponding pins, a floating mounting of the circuit board in the system support is possible in inexpensive manner. The individual operating elements are in this case mounted non-displaceably in the system support perpendicular to the lengthwise direction of the cutouts, and only the circuit board and the dials provided in the circuit board plane or dial planes are arranged displaceable relative to the system support. The floating mounting of the individual components of the system support, which mounting is not limited to circuit board and dials, can be readily assured by means of the pins and the corresponding slot connections. The connection of the individual components to the system support in this connection also provides certainty that normal movement of the components perpendicular to the system support is excluded. With a floating mounting of the circuit board in the system support, assurance is furthermore had that the contacting of drive systems and/or operating elements with the circuit board also takes place in floating fashion.

In this way, assurance is also obtained that the different coefficients of expansion of the individual components and/or circuit-board sections can be readily compensated for. In this connection, the slots are always so arranged that, with compensation for the manufacturing tolerances, a positioning with correct fit of the individual parts is assured. This correct positioning is assured also in the case of different temperature-produced expansions in length of the individual components. This is achieved, in particular, in the manner that the slots of the x- and y-axes are arranged at an approximately right angle. The slot extending in the y-axis is in this connection arranged substantially in the center of the corresponding components. If the pins are a part of the system support and are provided on its upper or lower side, a very high precision of positioning can be obtained, in particular of the circuit board with respect to the dial.

The attachment of the components to the system support can be effected, for instance, by means of screws and washers embossed thereon or rivets formed by extrusion thereon. The attachment of the individual components to the system support is effected in this connection independently of the type of fastening selected via slots in the components to be attached. They are advantageously always arranged in such a manner that the indicating system to be attached can be displaced with respect to each other in the slots upon a change in length of the components caused by temperature. This result is obtained in the manner that the lengthwise alignment of the slots takes place in accordance with a straight line from a zero point to the center of the corresponding slot. The zero point is, in this connection, the point of intersection of the longitudinal axes of the slots used for the positioning of the components.

Another preferred embodiment proceeds from the fact that the circuit board and those indicating systems which must be displaceable in order to compensate for stresses are mounted in the system support displaceable perpendicular to the lengthwise direction of the cutout. This can be done, in particular, in the manner that the displaceable circuit board and the displaceable indicating systems are held in cutout, in which connection structural parts of the system support which have the cutouts are fastened in the system support frame by arms which are resilient perpendicular to the lengthwise direction of the cutout.

It also advantageous for the circuit board (6) and/or the system support (21) to be divided into two or more circuit-board sections (22) or system-support sections which are connected to each other by at least one continuous connecting element (18'), and for the continuous connecting element (18') to be developed elastically or as a foil.

Furthermore, it is advantageous for the continuous connecting element (18') to consist of a material which is stronger or more easily deformable than the circuit-board sections (22) connected to the connecting element (18'), and the connecting element (18') and the circuit-board section (22) to be formed of different materials so that relative expansion by different amount is present between the connecting element (18') and the circuit-board section (22).

As a further development of the invention, it is advantageous for the continuous connecting element (18') to consists of a material which has a larger coefficient of expansion (σ) than the circuit-board section (22) connected to the connecting element (18'), and for the continuous, flexibly developed connecting element (18') to be developed as a single plate or as a foil on which the individual circuit-board sections (22) or rigid support elements are fastened.

It is also advantageous for the individual circuit-board sections (22) or rigid support elements to be connected to the connecting element (18') firmly by means of a conductive adhesive (37), and for the conductive adhesive (37) to consist of an insulating composition containing conducting particles which are so included in the insulating composition that a conductive connection is produced between the two parts to be fastened only in the direction in which the parts are pressed against each other.

Furthermore, it is advantageous for the individual circuit-board sections (22) or rigid support elements to be bonded or laminated on the connecting element (18'), and for the connecting element (18') to be rotatable, within a given angular range, around its longitudinal center axis and/or, between the parts to be connected, around its transverse axis.

It is furthermore advantageous for the connecting element (18') to be capable of bulging upon temperature variations between the individual circuit-board sections (22), and for the circuit board (6) to be developed as a flexible continuous plate or foil which is arranged on or bonded to several supporting elements (38) arranged spaced apart from each other.

It is furthermore advantageous for the flexible circuit board (6) to be connected via compensation loops (18) developed as connecting elements to the circuit-board sections (22) and be mounted on the plastic or system support (21).

By the advantageous development of the flexible connecting element which can be developed as continuous or single-piece plate, the pointer drive systems can be arranged at different angles to each other in an inexpensive and very favorable manner.

It is furthermore advantageous for the circuit board (6) and/or the system support (21) to be divided into two or more circuit-board sections (22) and/or system-support sections which are displaceable in several planes independently of each other. It is advantageous for the circuit-board sections (22) to be displaceable in the plane, transverse to the plane, and/or oblique to the plane of the circuit board (6).

It is furthermore advantageous for the circuit-board sections (22) to be connected to the circuit board by one or more points of intended breakage (50) and by one or more connecting elements (18) having windings (51).

As a further development of the invention, it is advantageous for the circuit-board sections (22) to be connected to the circuit board (6) by one or more connecting elements (18) which extend in meandering shape, and for the connecting elements (18) between the circuit-board sections (22) and the circuit board (6) to be developed as electrically conductive and/or electrically non-conductive connecting elements.

It is furthermore advantageous for the circuit-board sections (22) to be of rectangular or square shape and for each end edge (52), or the region of the circuit-board section (22) arranged adjoining the end edge, to be movably connected to the circuit board (6) within the cutout (23) of the circuit board (6) receiving the circuit-board section (22) by one or two connecting elements (18) and for a place of intended breakage (50) to be associated with each connecting element (18).

Furthermore, it is advantageous for each end edge (52) of the circuit-board section (22) to be connected via the place of intended breakage (50) with the end edge (19) of the cutout (23) which extends parallel to the end edge (52) of the circuit-board section (22), and for the two opposite places of intended breakage (50) to be broken upon extensive thermal expansion, and for the circuit-board section (22) to incline around the axis of the two remaining opposite places of intended breakage.

By the advantageous development of the circuit-board sections within the corresponding cutout of the circuit board and the advantageous development of the individual connecting elements, the circuit board can move in any desired direction and plane with respect to the circuit board if, as a result of high temperatures and the thermal expansion caused thereby, such a displacement of the circuit-board section is necessary. The connecting elements of a meandering shape are at the same time the current-conducting elements or conductor lugs, which are developed so strong that they can function at the same time as support elements. It is, of course, also possible to provide non-conducting connective elements as well as the connecting elements. Furthermore, the circuit-board sections can be firmly attached to the circuit board by connecting elements of intended-breakage type upon mounting, so that, until the final mounting, the circuit-board section retains its position in the same plane as the circuit board. After the mounting, the places of intended breakage can be broken. However, it is also possible for such places of intended breakage to break due to excessive thermal expansion, so that thereafter a tilting of swinging of the circuit-board section around the axis of the remaining connecting element of intended-breakage type takes place.

BRIEF DESCRIPTION OF THE DRAWINGS

With the above and other objects and advantages in view, the present invention will become more clearly understood in connection with the detailed description of a preferred embodiments, when considered with the accompanying drawings, of which:

FIG. 2 is a top view of the circuit board having various cutouts;

FIG. 4 is a top view of a circuit board having various cutouts to receive indicating displays, the individual sections being connected to each other by electric connecting elements;

FIG. 8 is an exploded view of another embodiment having a flexible, continuous circuit board which is arranged on several supporting elements spaced apart from each other;

FIG. 9 is a further embodiment of two circuit-board sections arranged spaced from each other and connected to each other by a foil;

DETAILED DESCRIPTION OF THE PREFERRED EMBODIMENTS

Figure 1:
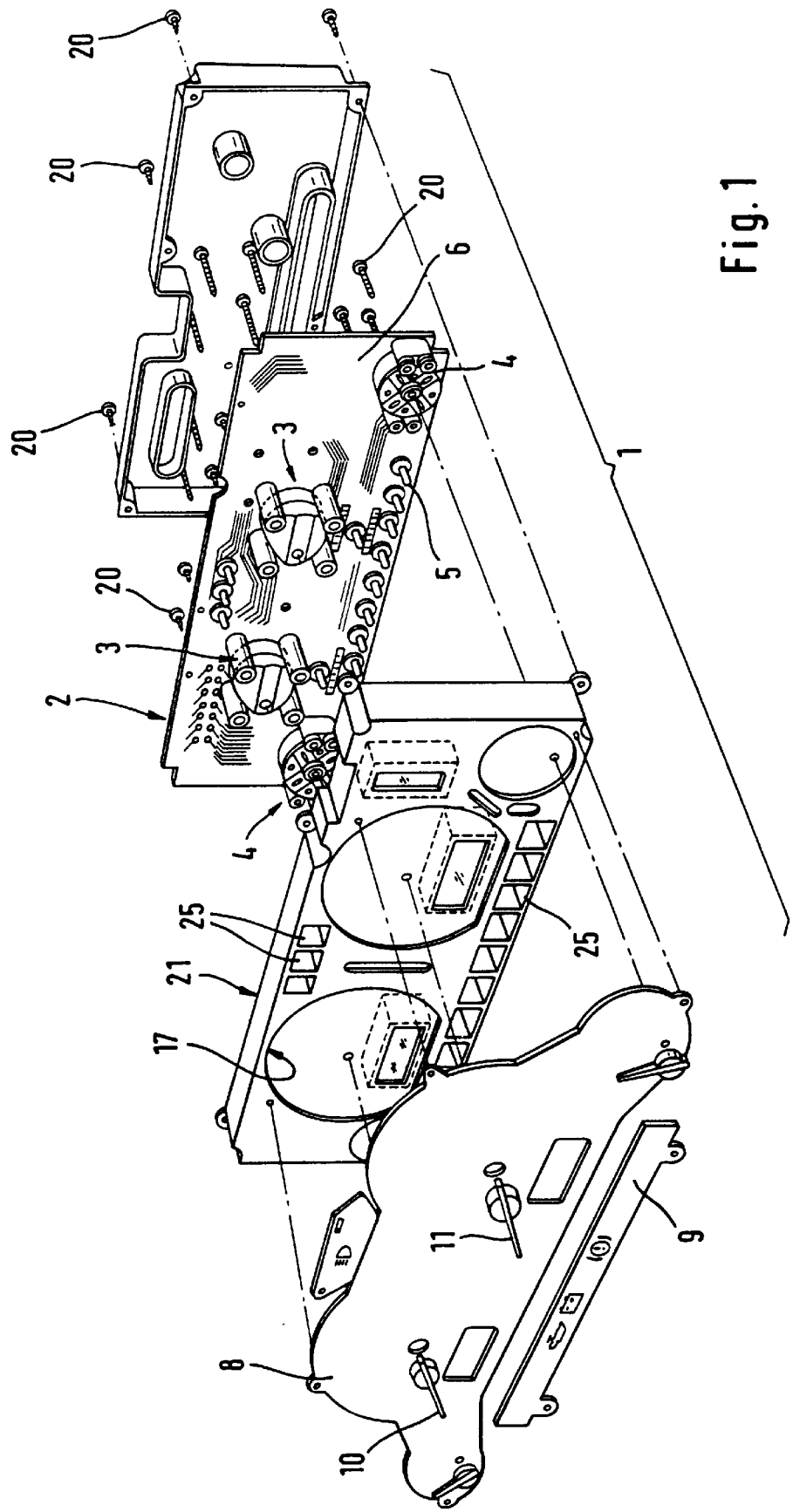
FIG. 1 is an exploded view of an instrument cluster with circuit board adapted to be installed in a housing, numerous indicating components or sources of light being provided on the circuit board.

In FIG. 1 of the drawing, 1 is an instrument cluster, shown in an exploded view of this figure. The individual parts of the instrument cluster can be connected to each other by connecting elements or threaded bolts 20.

The instrument cluster 1 has a system support or a cluster housing 21 in which numerous cutouts or openings 17 are arranged alongside each other to receive indicating elements or measurement mechanisms 3, 4, 5. Referring to FIG. 1, behind the system support 21 there is an indicating system 2 on which the numerous measurement movements 3, 4 and/or the indicating components 5 or light shafts 25 provided for sources of light are arranged. Further operating elements, for instance drive assemblies. LCD-indicating devices, individual parts of indicating devices, conductive rubber, diffusing screens and color screens, light-guidance parts, as well as switch mats and rams which are of importance in connection with the instrument cluster have not been shown in detail and have been omitted for the sake of simplicity.

The indicating system 2 or a corresponding circuit board 6 is inserted from the rear into the box-shaped cluster housing 21 and then detachably connected to the system support or cluster housing 21.

Figure 3:
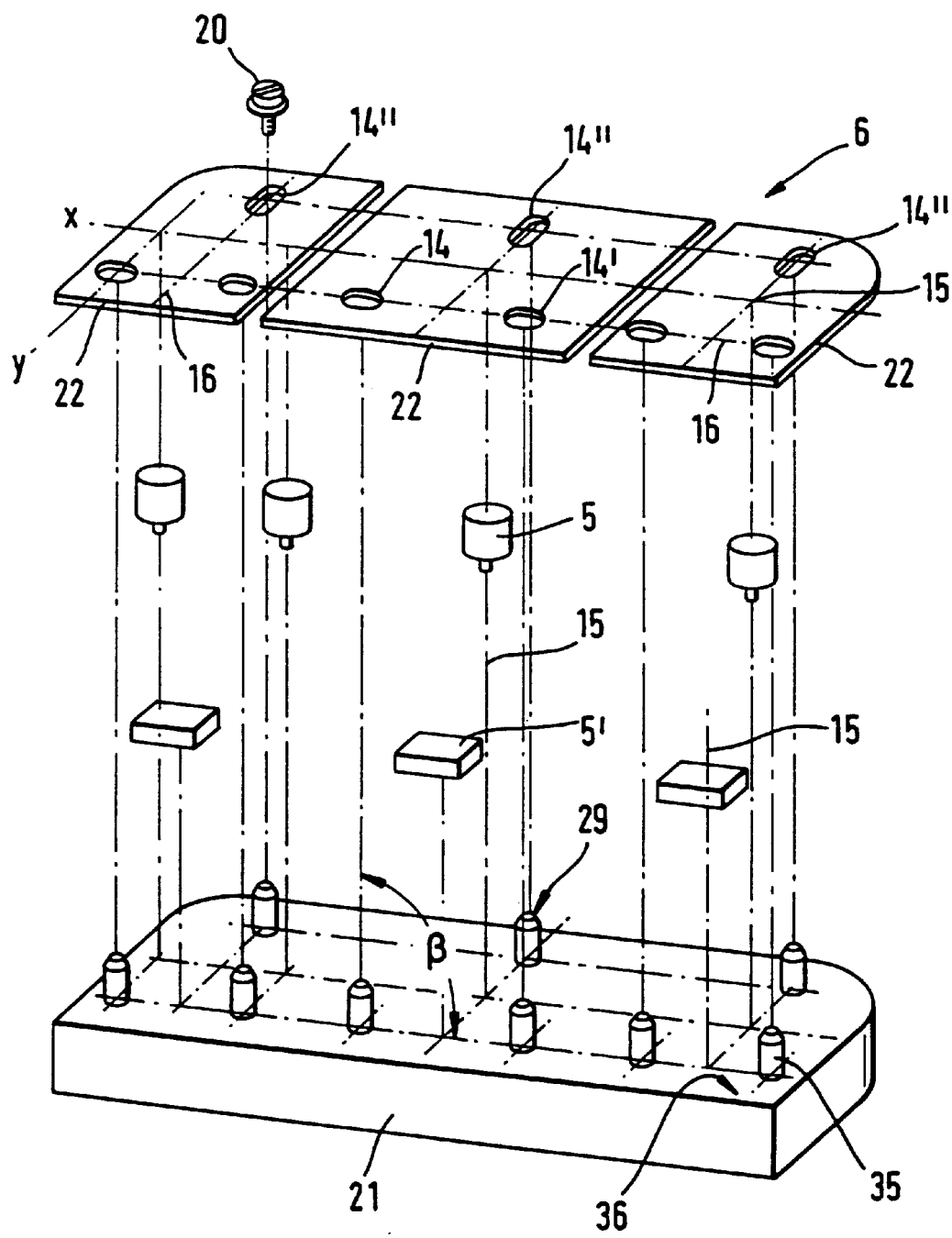
FIG. 3 is an exploded view of the instrument cluster with the circuit board which can be installed in a housing as well as the corresponding indicating systems.

The connection between the circuit board 6 nd the cluster housing 21 is effected by plug attachments, in particular via the fastening elements or threaded parts 20, which for this purpose are introduced into corresponding mounting openings or threaded holes 29 (FIG. 3).

As can be noted From FIG. 1, a single-piece dial 8 can be arranged on the front of the cluster housing 1 and also, if desired, a mask 9. The attachment of the dial 8 to the cluster housing 21 is also effected by threaded bolts, not shown.

On the front side of the cluster housing 21, symbol disks can furthermore be applied and attached permanently to it. After the mounting of the circuit board 6, pointers 10 and 11 can be mounted on the shafts of the measurement movements 3 and 4. The instrument cluster unit 1 which is thus assembled can then be inserted in the front frame (not shown in the drawing for the sake of simplicity) of the instrument cluster and secured therein. For this, there are used connecting elements, not shown in the drawing, such as film hinges, which connect the front frame to a lightbox (not shown in the drawing) which contains illuminating bodies. The current supply for the illuminating bodies is effected via electric connections, not shown in the drawing, which are connected to the circuit board. The front frame can be closed by a suitable cover glass. After suitable fitting of the cluster housing with the corresponding components, the mounting is concluded.

FIG. 2 shows a first embodiment of the circuit board 6 of the invention which, as already mentioned, can be connected via the fastening elements or screws 20 to the system support or cluster housing 21 in order to receive pointers or other indicating elements.

The connection between the system support 21 and the circuit board 6 attached to the system support, which connection permits relative movement between them, is shown in the exploded view of FIG. 3. The system support 21, as can be noted from FIG. 3, has numerous pins 35 with threaded bores 29 arranged on a surface 36 of the system support 21 at a uniform distance from each other, they being part of the fastening elements for connecting the system support 21 to the circuit board 6. The pins 35 are arranged vertically on the surface 36 of the system support 21 so that the longitudinal center line of the pin 35 forms a right angle β with the surface 36. The pins 35 arranged on the surface 36 of the system support 21 extend, in the installed condition of the circuit board 6, through corresponding slots 14 to 14''' (see also FIGS. 5, 7) which are the same distance apart as the pins 35 and, as already mentioned, are aligned with them, so that at least some of the pins 35 can be received movably in these slots 14 to 14'''. Therefore, if the circuit board 6 has been placed on the pins 35, the corresponding fastening elements or screws 20 can be screwed into the threaded bore 29 provided in the pins 35 and thus secure the circuit board 6 to the system support 21. Washers (not shown in the drawing) the outside diameter of which is greater than the longest dimension of the slots 14 to 14''' can be provided between the bottom of the screw head of the threaded bolt 20 and the surface of the circuit board 6, so that relative movement is possible between the circuit board 6 and the system support 21. The displacement of the circuit board 6 takes place in this connection parallel to the surface 36 of the system support 21 (see FIGS. 2, 3, 4, 5, 7).

Depending on the embodiment, it is also possible to displace the circuit board 6 on the bolts 20 in the direction towards the surface 36 of the system support 21 or in opposite directions.

As can be noted from FIGS. 3, 4, the circuit board 6 consists of three circuit-board sections 22, spaced apart from each other, in each of which the three slots 14 to 14''', arranged spaced from each other, are provided. Depending on the size of the entire circuit board, two or more circuit-board sections—and therefore also more than three—can form a complete circuit board.

The individual slots 14 to 14'' extend on linear axes 16. In the embodiment shown in FIG. 3, two slots 14 and 14' are provided on the axis 16 (x-direction) which extend parallel to the longitudinal side of the circuit board 6. The third slot 14'' is also located on the axis 16 (y-direction) which intersects the axis 16 (x-direction) at a right angle α.

In this way, any one of the circuit-board sections 22 can be displaced with respect to an adjacent circuit-board section 22 as well as with respect to the system support 21 without the circuit-board sections 22 contacting each other. In this way, even large temperature variations and the corresponding changes in size of the individual circuit-board sections 22 can be compensated for, i.e., the circuit-board sections 22 can expand and contract without the circuit board 6 being warped thereby. Furthermore, due to the advantageous selection of the slots 14 and their arrangement on the surface of the circuit board 6, assurance is had that the corresponding indicating element does not shift with respect to the dial. For this, it is advantageous that at least one axis 16 of a slot 14 intersect a measurement center point 15, 15' or, if only three slots are provided, that two thereof lie in a common axis which intersects the axis 16 of another slot arranged perpendicular thereto at an angle α of 90° (see FIG. 3).

The embodiment in accordance with FIG. 4, which only slightly differs from the embodiment of FIG. 3, also shows the three circuit-board sections 22 arranged spaced from each other and connected to each other by electric connecting elements 18 which can either be developed of variable length or elastically, and serve for the transmission of signals and energy between the individual circuit-board sections 22. The individual segments or partly uncoupled circuit-board sections 22 are connected mechanically via the slots 14 to 14" arranged at right angle with the pins 35 provided on the system support 21, which pins are provided for this purpose with the corresponding threaded bores 29 to receive the fastening elements 20. The slots 14 to 14" arranged on the axes 16 intersect at an angle α of 90°. The point of intersection or measurement center 15 of the axes 16 of the middle circuit-board section 22 correspond to the x-zero point 39, which also corresponds to the point of intersection or measurement center 14 of the measurement movement or the indicating component 5. In this way, the result is obtained that the distance from the outermost contacting point to the x-zero point 39 is minimized. This minimizing has the result that the slight temperature-produced changes in differential length can be taken up by the contacting elements.

It is also possible, in accordance with FIG. 4, for the two intersecting axes of the right or left circuit-board section 22 to form the center point 15 and for the two measurement center points 15' of two measurement movements to be arranged symmetrically on both sides of the center point 15.

In the embodiment in accordance with FIG. 2, the circuit board 6 has two recesses or cutouts 23 with inner edges 19 which are defined by an inner boundary 34. The rectangular cutout 23 serves to receive in each case one circuit-board section 22' which is also provided with two slots 14, 14' arranged on the axis 16. The axis 16 also intersects a further axis 16 which is arranged perpendicular thereto and on which there is only one slot 14". The two axes 16 intersect at the measurement center point 15. The circuit-board sections 22 are again connected via the electrically conductive elastic connecting elements 18 to the rest of the circuit board 6.

The circuit board 6 can also have three slots 14 to 14", which are also arranged on the axes 6 aligned at right angles to each other and which intersect at a center point 15' of the circuit board 6. By the advantageous uncoupling of the circuit-board sections 22 which serve to receive the LCD indicators, changes in the operating temperature between indicating display and contacting device can be readily compensated for since any warping of the circuit board 6 which occurs cannot have any effect on the circuit-board sections 22. In this way, the operability of the indicating components or indicating display 5' is retained. The distance between an inner boundary 24 of the circuit-board section 22 and the boundary 34 of the section 23 offers sufficient clearance for this.

Figure 5:
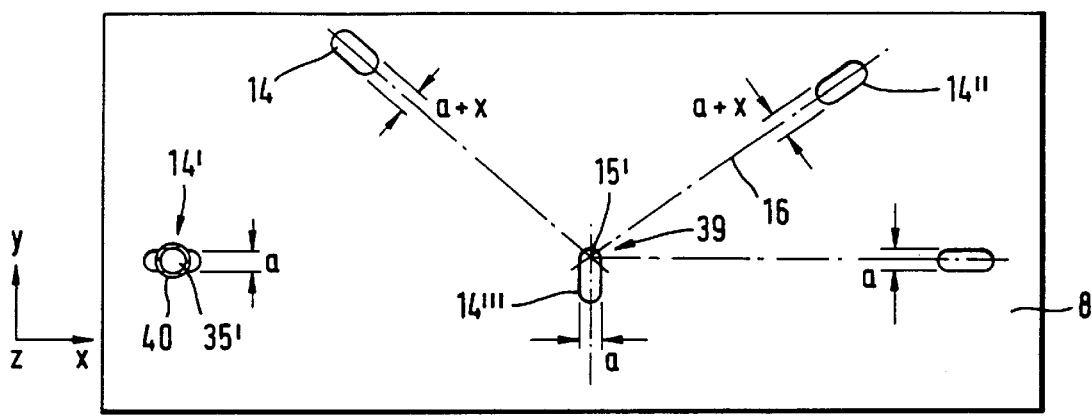
FIG. 5 is a top view of the embodiment of FIG. 6.
Figure 6:
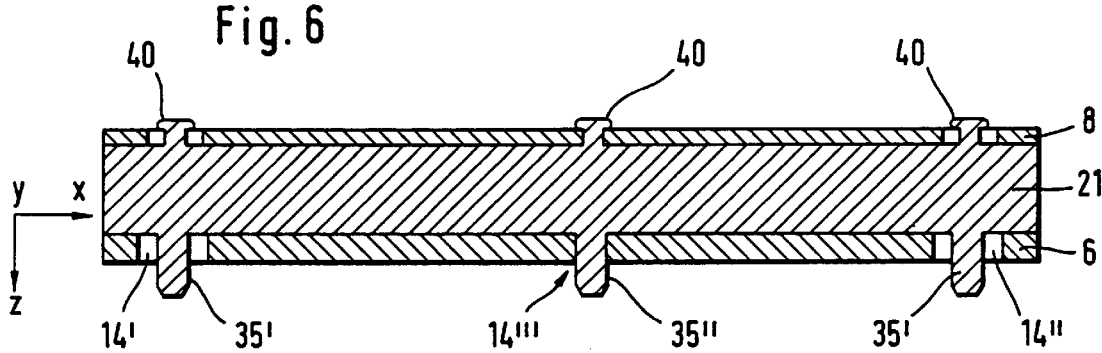
FIG. 6 is a second embodiment of the system support, shown in cross section.
Figure 7:
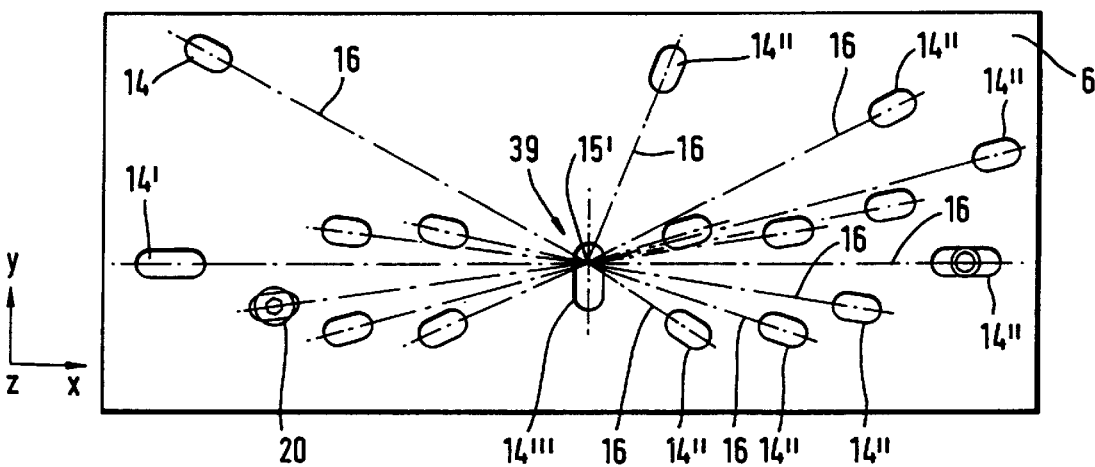
FIG. 7 is the circuit board of FIG. 8, but with numerous slots which are arranged on intersecting axes.

FIGS. 5 to 7 show two further embodiments of the circuit board 6 which is connected to the system support 21 by the numerous slots 14' to 14'''.

FIGS. 6 and 7 show that the system support 21 has two pins 35' adjacent to its narrow sides in the region of the center of the narrow sides, and furthermore another pin 35'' spaced from the lower longitudinal side in the region of the center of the longitudinal side. The pins 35' and 35'' protrude beyond the rear surface of the system support 21 and engage into the slots 14 to 14''' of the circuit board 6 which are shown in FIG. 7. The slots 14, 14' of the circuit board 6 which correspond to the pins 35'' extend in the longitudinal direction of the circuit board 6, while the slot cutout 14''' corresponding to the pin 35' extends in the transverse direction thereof. Due to the different coefficients of thermal expansion of circuit board 6 and system support 21, relative movement of the system support 21 with respect to the circuit board 6 in x- and y-direction is possible, specifically in the region of the pins 35' and 35''.

In order that the circuit board 6 can be conductively connected to the system support 21, and furthermore for relative movement between circuit board 6 and the corresponding indicating systems and the operating elements to be possible, the aforementioned slots 14'' are provided in the circuit board 6. They are suitably connected to operating elements (not shown) in the region of the indicating system, all longitudinal axes 16 of the slots 14 to 14'' diverging radially from the zero-point 15' and extending radially outward. The attachment of the circuit board 6 to the system support 21 can be effected by screwing or rivetting.

As can be noted from FIG. 7, the screw 20 which is introduced into the slot 14 of the circuit board 6 is screwed into the system support 21. The screw head of the screw 20 holds the circuit board 6 in the z-direction shown in FIG. 7, i.e. in a direction perpendicular to the plane of the board, while a displacement of the circuit board 6 in the x-y plane is still possible. Further screws or rivet connections for the fastening of the circuit board 6 to the system support 21 can also be used.

The circuit board 6 is not only provided for the electrical contacting of the display system and operating elements, but it also holds structural parts in z-direction. In order that the circuit board 6 can move relatively on the system support 21, all slots 14 to 14''' have a width which is greater by the possible thermal-expansion play in x- and y-directions than the threaded section of the corresponding screw or pin.

The washers provided for the screws are so large that they overlap the corresponding slots 14 to 14'''.

As can furthermore be noted from FIG. 6, the system support 21 has, on the side facing away from the circuit board 6, this pins 35' and 35'' which can be received in the slots 14' 14'''. The slots 14' extend in x-direction, while the slots 14'' extend in y-direction. In the drawing, 40 is a cold, hot or ultrasonically peened-over widening in the region of the pin 35', i.e. the dial 8 is attached by cold, hot or ultrasonic peening to the system support 21. As can be noted from FIG. 5, the width of the slots 14' is of the size a+x in order to permit compensation for expansion. The longitudinal axes of the slots 14 to 14'' in the dial 8 are so oriented that they all intersect at the point 15' or in the intersection line of the longitudinal axes 16 of the slots 14 to 15'' (see FIG. 7).

It is also possible, differing from the previous embodiments, for the individual connecting elements 18 between the circuit boards 22 to be developed as a single continuous flexible foil 15 or 18' which is firmly attached to the circuit-board segments or supporting elements 38 for instance by means of an adhesive. The different electronic components or measuring elements are present on the circuit board 6.

Instead of a bonding or soldering of the flexible foil to the circuit-board segments 38 it is also possible to fasten them by clamping or by spring elements.

For this purpose, it is possible for the circuit board 6 itself to be flexible and to be firmly connected to the supporting segments or plates or bonded onto them. In this way, there is a possibility or arranging the individual pointer drive systems in different planes form each other.

The continuous connecting element 18 or the foil 18' can consist of a material which is more deformable or substantially more easily deformable than the circuit-board sections 22 connected by the connecting element 18. Since the connecting element 18 and the circuit-board sections 22 can be formed of different materials, a different amount of relative expansion of the parts which are connected to each other is also obtained. For the connecting of the individual parts to each other, a conductive adhesive can be used in which there are contained conductive particles which are so introduced into the adhesive that a conductive connection is produced between the two parts to be fastened only in the direction in which the parts are pressed against each other. In order to arrange the individual pointer drive system at different angles to each other, the connecting element or the foil 18' can be rotatable around its longitudinal center axis and/or around the transverse axis between the parts to be connected within given angular regions.

In the embodiment according to FIG. 8, the individual circuit-board segments 38 can also be connected to each other by the equalizing loops developed as connecting element 18 which, as already mentioned, are mounted on circuit-board segments or supporting elements 38, similar to the other embodiments. The flexible circuit board 6 or the individual circuit-board sections 22 are mounted on the circuit-board segments 38, and the latter are mounted on the plastic or system support 21.

Figure 10:
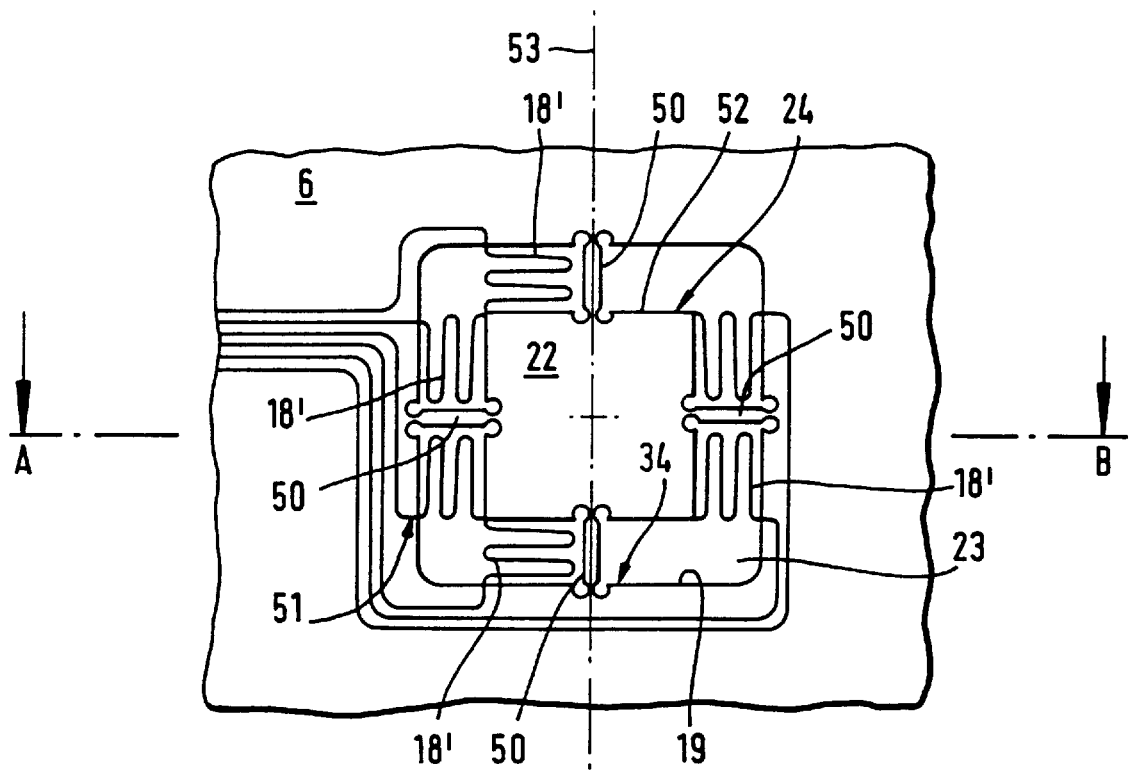
FIG. 10 is another embodiment of a circuit board with circuit-board sections mounted movably in all planes, seen in top view.

In the embodiment shown in FIG. 10, the circuit board 6, similar to the embodiment in accordance with FIG. 2, has one or more recesses or cutouts 23 which are defined by an inner boundary 34. The boundary 34 corresponds in the end edge designated 19 of the cutout 23. In FIG. 10, only one cutout 23 is shown. However, it is possible to provide several identical cutouts 23 in the circuit board 6. The cutout of FIG. 10 is rectangular. However, it is also possible for the cutout 23 to be square, circular, elliptical, or other shape.

The rectangular cutout 23 serves to receive the circuit-board section 22 which is firmly attached to the corresponding oppositely located end edge 19 of the cutout 23 by four points 50 of intended breakage in the embodiment according to FIG. 10.

The places 50 of intended breakage can be provided as mounting aid so that the circuit board 6 with the circuit-board section 22 can be handled more easily for mounting. It is also possible to separate or loosen the planes of intended breakage 50 only when excessive expansion of the circuit-board section 22 with respect to the circuit board 6 takes place. Depending on the shape and development of the circuit board 6, it is possible, for instance, for merely two points of intended breakage 50 which lie opposite each other to be broken, so that then, as shown in FIG. 11, the circuit-board section 22 can swing around an axis 53 of the two opposite points of intended breakage 50 which then continue to contribute to stabilizing the circuit-board section 22 with respect to the circuit board 6 within the cutout 23.

In addition to the individual four points of intended breakage 50 provided in the embodiment according to FIG. 10, four or six electrically conductive connecting elements 18' can be provided which are connected to the circuit-board sections 22. The connecting elements 18' can be developed as conductive lugs and be connected to the circuit board 6. It is then also possible in advantageous manner for the individual connecting elements 18' or conductive lugs to function as supporting elements and to support the circuit-board section 22 within the cutout 23.

The individual connecting elements 18' can be wound one or more times or, as shown in FIG. 10, have a meandering course 51, so that the circuit-board section 22 can shift within a large region relative to the circuit board 6. The distance between the end edge 19 of the cutout 23 and the end edge 52 of the circuit-board section 22 can have a value which corresponds to a third of the total width of the circuit-board section 22.

Figure 11:
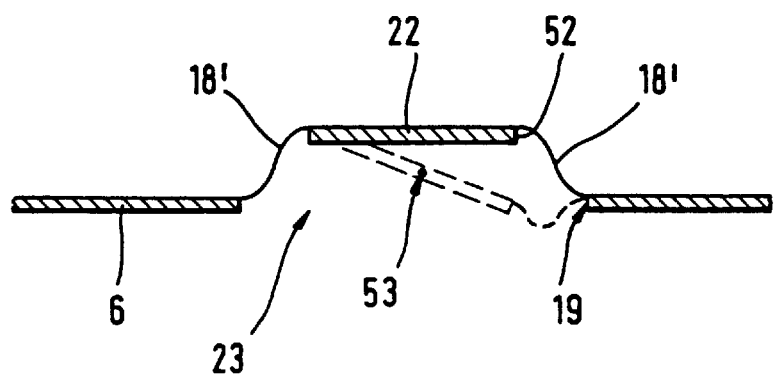
FIG. 11 is a cross section along the line A–B of FIG. 10.

In the embodiment according to FIG. 11, the circuit-board section 22 is above the cutout 23. The position of the circuit-board section 22 shown in FIG. 11 can also be considered the normal position, and it shows that displacement of the circuit-board section 22, in particular in the direction which is transverse to the surface of the circuit board 6, is possible.

We claim:

1. An instrument cluster comprising a housing, a system support to receive indicating instruments, fastening elements, and a circuit board which is enclosed by the housing and is connected by the fastening elements to the system support;

wherein the circuit board is mounted movably with respect to the system support by means of the fastening elements; and the circuit board is divided into a plurality of circuit-board sections which are displaceable relative to the system support independently of each other in at least one plane.

2. An instrument cluster according to claim 1, further comprising connecting elements; and wherein the individual circuit-board sections are equipped with at least one individual display including an indicating instrument, and rest via the connecting elements on circuit-board sections on the parts thereof.

3. An instrument cluster according to claim 2, wherein the connecting elements have a variable length.

4. An instrument cluster according to claim 2, wherein the connecting elements comprise an elastic.

5. An instrument cluster according to claim 2, wherein the circuit-board sections are connected to each other by at least one of said connecting elements, said at least one connecting element being a continuous connecting element.

6. An instrument cluster according to claim 5, wherein the continuous connecting element is an elastic or a foil.

7. An instrument cluster according to claim 6, wherein the continuous connecting element is made of a material which is stronger and more easily deformable than the circuit-board sections.

8. An instrument cluster according to claim 7, wherein the connecting element and the circuit-board section are formed of different materials so that relative expansion by different amounts is present between the connecting element and the circuit-board section.

9. An instrument cluster according to claim 8, wherein the continuous connecting element is made of a material which has a larger coefficient of expansion than a circuit-board section connected to the connecting element.

10. An instrument cluster according to claim 9, wherein the continuous flexibly developed connecting element is formed as a single foil on which the individual circuit-board sections are fastened.

11. An instrument cluster according to claim 2, wherein the individual ones of the circuit-board sections are connected to one of the connecting elements firmly by means of a conductive adhesive.

12. An instrument cluster according to claim 11, wherein the conductive adhesive is made of an insulating composition containing conducting particles which are so included in the insulating composition that a conductive connection is produced between two elements of the instrument cluster to be fastened only in the direction in which the elements are pressed against each other.

13. An instrument cluster according to claim 11, wherein individual ones of the circuit-board sections are affixed by a bond or a lamination to the connecting element.

14. An instrument cluster according to claim 2, wherein one of the connecting elements is rotatable, within a given angular range, around its longitudinal center axis.

15. An instrument cluster according to claim 2, wherein one of the connecting elements is rotatable, within a given angular range, around its transverse axis between elements of the instrument cluster to be connected.

16. An instrument cluster according to claim 2, wherein, at least one of the connecting elements is capable of bulging upon temperature variations between the individual circuit-board sections.

17. An instrument cluster according to claim 2, wherein the circuit-board sections are connected to the circuit board by at least one of said connecting elements which extend in meandering shape.

18. An instrument cluster according to claim 1, further comprising connecting elements; and wherein the individual circuit-board sections are connected via the connecting elements to adjacent circuit-board sections and are movable independently of each other with respect to the adjacent circuit-board sections and the system support cluster housing.

19. An instrument cluster according to claim 1, further comprising connecting elements; and wherein the individual circuit-board sections are connected via the connecting elements to adjacent circuit-board sections and are movable independently of each other with respect to the adjacent circuit-board sections and the system support cluster housing.

20. An instrument cluster according to claim 1, wherein the connecting elements or support elements permit displacement of the circuit-board sections with respect to each other.

21. An instrument cluster according to claim 1, wherein the circuit board and the system support have one or more cutouts.

22. An instrument cluster according to claim 21, wherein the cutouts have a lengthwise direction, the instrument cluster includes resilient webs; and the indicating systems contained in cutouts are arranged perpendicular to the lengthwise direction of the cutouts and are connected via the resilient webs indirectly or directly to the system support.

23. An instrument cluster according to claim 1, wherein said indicating instruments constitute an indicating system having a center point;

the circuit-board sections have openings a plurality of which are arranged on a plane which intersects the center point of the indicating system.

24. An instrument cluster according to claim 23, wherein the circuit-board sections have numerous ones of said openings which are arranged on two or more axes which intersect the center point of the measurement system.

25. An instrument cluster according to claim 24, wherein one of said indicating instruments has a pointer axis at said center point.

26. An instrument cluster according to claim 24, wherein in the indicating system, one of said axes is a center axis which extends parallel to a common plane of a plurality of the openings.

27. An instrument cluster according to claim 26, wherein the openings of the circuit-board sections are slots extending in a longitudinal direction, and said center axis extends in the longitudinal directions of a plurality of the slots.

28. An instrument cluster according to claim 27, wherein the longitudinal direction of at least one longitudinal slot located in a central region of the circuit board extends parallel to said center axis, and the longitudinal direction of at least one other slot located outside the central region of the circuit board extends perpendicular to said center axis.

29. An instrument cluster according to claim 24, further comprising electrically conductive connecting elements, wherein the connecting elements connect the circuit-board sections electrically to each other.

30. An instrument cluster according to claim 1, wherein the circuit-board sections and the system support are displaceable in several planes independently of each other.

31. An instrument cluster according to claim 1, wherein the circuit-board sections are displaceable in a direction transverse to a plane of the circuit board.

32. An instrument cluster comprising a housing, a system support to receive indicating instruments, fastening elements, and a circuit board which is enclosed by the housing and is connected by the fastening elements to the system support;

wherein the circuit board is mounted movably with respect to the system support by means of the fastening elements;

the circuit board is divided into a plurality of circuit-board sections which are displaceable relative to the system support independently of each other in at least one plane;

said indicating instrument constitutes an indicating system having a center point;

the circuit-board sections have openings a plurality of which are arranged on a plane which intersects the center point of the indicating system;

the circuit-board sections have numerous ones of said openings which are arranged on two or more axes which intersect the center point of the measurement system;

one of said indicating instruments has a pointer axis at said center point;

in the indicating system, one of said axes which extends parallel to a common plane of a plurality of the openings;

the openings of the circuit-board sections are slots extending in a longitudinal direction, and said center axis extends in the longitudinal directions of a plurality of the slots; and the system support has pins engageable in the slots for receiving the circuit-board sections.

33. An instrument cluster according to claim 32, wherein the pins are arranged on one side of the system support facing the circuit board, and are perpendicular to a surface of the one side of the system support.

34. An instrument cluster comprising a housing, a system support to receive indicating instruments, fastening elements, and a circuit board which is enclosed by the housing and is connected by the fastening elements to the system support;
   wherein the circuit board is mounted movably with respect to the system support by means of the fastening elements;
   the circuit board is divided into a plurality of circuit-board sections which are displaceable relative to the system support independently of each other in at least one plane;
   said indicating instrument constitutes an indicating system having a center point;
   the circuit-board sections have openings a plurality of which are arranged on a plane which intersects the center point of the indicating system;
   the circuit-board sections have numerous ones of said openings which are arranged on two or more axes which intersect the center point of the measurement system;
   one of said indicating instruments has a pointer axis at said center point;
   in the indicating system, one of said axes is a center axis which extends parallel to a common plane of a plurality of the openings;
   the openings of the circuit-board sections are slots extending in a longitudinal direction, and said center axis extends in the longitudinal direction of a plurality of the slots;
   the system support has pins extending toward the circuit board for engagement with the slots, and threaded bolts to be received by respective ones of the pins; and
   the pins are displaceably received approximately in the center of the slots and receive the threaded bolts for securing individual ones of circuit-board sections.

35. An instrument cluster according to claim 34, wherein said indicating instrument includes a dial, and
   additional ones of said slots are provided in the circuit board and in the dial for securing the circuit board and the dial to the system support, the lengthwise direction of the additional slots being on a radius from said central zero point of the circuit board.

36. An instrument cluster according to claim 35, wherein the center point is in one of said slots located in the central region and directed in the transverse direction.

37. An instrument cluster according to claim 36, wherein the circuit board and the indicating instruments are movable perpendicular to the lengthwise direction of the slots.

38. An instrument cluster comprising a housing, a system support to receive indicating instruments, fastening elements, and a circuit board which is enclosed by the housing and is connected by the fastening elements to the system support;
   wherein the circuit board is mounted movably with respect to the system support by means of the fastening elements;
   the circuit board is divided into a plurality of circuit-board sections which are displaceable relative to the system support independently of each other in at least one plane; and
   the circuit board is formed as a flexible continuous plate and comprises a plurality of supporting elements bonded to the plate, the supporting elements being spaced apart from each other.

39. An instrument cluster comprising a housing, a system support to receive indicating instruments, fastening elements, connecting elements, and a circuit board which is enclosed by the housing and is connected by the fastening elements to the system support;
   wherein the circuit board is mounted movably with respect to the system support by means of the fastening elements;
   the circuit board is divided into a plurality of circuit-board sections which are displaceable relative to the system support independently of each other in at least one plane;
   the individual circuit-board sections are equipped with at least one individual display including an indicating instrument, and rest via the connecting elements on circuit-board sections on the parts thereof;
   the connecting elements have points of intended breakage; and
   the circuit-board sections are connected to the circuit board by at least one point of intended breakage.

40. An instrument cluster comprising a housing, a system support to receive indicating instruments, fastening elements, connecting elements, and a circuit board which is enclosed by the housing and is connected by the fastening elements to the system support;
   wherein the circuit board is mounted movably with respect to the system support by means of the fastening elements;
   the circuit board is divided into a plurality of circuit-board sections which are displaceable relative to the system support independently of each other in at least one plane;
   the individual circuit-board sections are equipped with at least one individual display including an indicating instrument, and rest via the connecting elements on circuit-board sections on the parts thereof; and
   the circuit-board sections are connected to the circuit board by at least one of said connecting elements having windings for connection of the circuit-board sections.

41. An instrument cluster comprising a housing, a system support to receive indicating instruments, fastening elements, connecting elements, and a circuit board which is enclosed by the housing and is connected by the fastening elements to the system support;
   wherein the circuit board is mounted movably with respect to the system support by means of the fastening elements;
   the circuit board is divided into a plurality of circuit-board sections which are displaceable relative to the system support independently of each other in at least one plane;
   the individual circuit-board sections are equipped with at least one individual display including an indicating instrument, and rest via the connecting elements on circuit-board sections on the parts thereof; and
   the connecting elements between the circuit-board sections and the circuit board are developed as electrically conductive elements.

42. An instrument cluster according to claim 41, wherein each end edge of the circuit-board section is connected via the place of intended breakage with a edge of a respective one of the cutouts.

43. An instrument cluster according to claim 42, wherein the places of intended breakage are arranged on opposite sides of a circuit-board section; and the two opposite places of intended breakage are broken upon extensive thermal expansion; and upon inclination of the circuit-board section is around an axis, there is breakage of another pair of opposite places of intended breakage.

44. An instrument cluster comprising a housing, a system support to receive indicating instruments, fastening elements, connecting elements, and a circuit board which is enclosed by the housing and is connected by the fastening elements to the system support;

wherein the circuit board is mounted movably with respect to the system support by means of the fastening elements;

the circuit board is divided into a plurality of circuit-board sections which are displaceable relative to the system support independently of each other in at least one plane;

the individual circuit-board sections are equipped with at least one individual display including an indicating instrument, and rest via the connecting elements on circuit-board sections on the parts thereof;

the circuit-board has cutouts for receiving the circuit-board sections; and the circuit-board sections are of rectangular or square shape, are arranged adjoining their end edges, and are movably connected to the circuit board within the respective cutouts of the circuit board by at least one of said connecting elements.

45. An instrument cluster according to claim 44, wherein each connecting element has a place of intended breakage.

46. An instrument cluster according to claim 1, wherein the circuit board has cutouts for receiving the circuit board sections, and the outer boundaries of the circuit-board sections contained in the cutouts are on all sides at approximately the same distance from the boundary of the cutout.

47. An instrument cluster according to claim 46, further comprising connecting elements connecting between adjacent circuit board-sections;

wherein the circuit-board sections received in the cutouts are connected movably with the circuit board by the numerous ones of the connecting elements.

48. An instrument cluster according to claim 25, wherein said connecting elements comprise compensation loops; and said circuit board is flexible and sections of the board are connected via compensation loops for mounting on the system support.

49. An instrument cluster according to claim 1, wherein the circuit-board sections are displaceable in a direction oblique to a plane of the circuit board.

* * * * *